(12) United States Patent
Lee

(10) Patent No.: US 9,685,451 B2
(45) Date of Patent: Jun. 20, 2017

(54) NONVOLATILE MEMORY DEVICE AND METHOD FOR FABRICATING THE SAME

(75) Inventor: Nam-Jae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/610,785

(22) Filed: Sep. 11, 2012

(65) Prior Publication Data

US 2013/0307028 A1    Nov. 21, 2013

(30) Foreign Application Priority Data

May 15, 2012 (KR) ................. 10-2012-0051591

(51) Int. Cl.
  *H01L 29/788* (2006.01)
  *H01L 27/11524* (2017.01)

(52) U.S. Cl.
  CPC .............. *H01L 27/11524* (2013.01)

(58) Field of Classification Search
  CPC ............ H01L 27/11524; H01L 27/11551
  USPC ........................ 257/321, E27.103
  See application file for complete search history.

(56) References Cited

U.S. PATENT DOCUMENTS

| | | | |
|---|---|---|---|
| 7,608,507 B2 | 10/2009 | Lee et al. | |
| 2008/0268595 A1* | 10/2008 | Lee et al. | 438/258 |
| 2010/0214838 A1* | 8/2010 | Hishida et al. | 365/185.11 |
| 2011/0169072 A1* | 7/2011 | Lim et al. | 257/329 |
| 2012/0168957 A1* | 7/2012 | Srivastava | H01L 21/31144 257/774 |

FOREIGN PATENT DOCUMENTS

KR    1020080099170    11/2008

\* cited by examiner

*Primary Examiner* — Hsin-Yi Hsieh
(74) *Attorney, Agent, or Firm* — I P & T Group LLP

(57) ABSTRACT

A nonvolatile memory device includes cell strings, each including a plurality of memory cells over a substrate, extending in a direction, channel layers, connected with one sides and the other sides of the cell strings, extending in another direction perpendicular to the substrate, select gate electrodes, located over the cell strings, surrounding side surfaces of the channel layers with a gate dielectric layer interposed therebetween, and conductive lines connected with upper ends of the channel layers.

6 Claims, 12 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0051591, filed on May 15, 2012, which is incorporated herein by reference in its entirety.

BACKGROUND

1. Field

Exemplary embodiments of the present invention relate to a nonvolatile memory device and a method for fabricating the same, and more particularly, to a nonvolatile memory device including a cell string in which a plurality of memory cells are connected in series and a method for fabricating the same.

2. Description of the Related Art

A nonvolatile memory device is a kind of memory device which is capable of retaining stored data even when power supply is interrupted. Various nonvolatile memory devices such as a flash memory have been widely used.

FIG. 1 is a view illustrating a conventional nonvolatile memory device.

Referring to FIG. 1, a conventional nonvolatile memory device may include a tunnel dielectric layer 15, a plurality of gate patterns, first and second spacer dielectric layers 45 and 50, an interlayer dielectric layer 55, and contact plugs 60. The tunnel dielectric layer 15 is formed on a substrate 10. The plurality of gate patterns includes a floating gate electrode layer 20, a charge blocking layer 25, a passivation layer 30, a control gate electrode layer 35, and a gate hard mask layer 40, which are sequentially stacked on the tunnel dielectric layer 15. The first and second spacer dielectric layers 45 and 50 cover the plurality of gate patterns. The interlayer dielectric layer 55 is formed on the second spacer dielectric layer 50. The contact plugs 60 are formed to pass through the interlayer dielectric layer 55, the second spacer dielectric layer 50, and the tunnel dielectric layer 15. The contact plugs 60 are connected with the junction regions of the substrate 10.

In the conventional art, a chip size increases because a select line SL having a larger width than a word line WL occupies a substantially big area. In particular, in a case where word lines WL are formed by a spacer patterning technology (SPT), separate processes are required to form select lines SL with a width different from that of the word lines WL. Also, perturbation may occur by hot carrier injection (HCI) in the word lines WL which adjoin the select lines SL. Moreover, as a design rule decreases, it becomes gradually difficult to perform a process for partially removing the charge blocking layer 25 in the select lines SL.

SUMMARY

Embodiments of the present invention are directed to a nonvolatile memory device including select gate electrodes formed over a cell string, in order to reduce a chip size, make fabrication processes easier and simpler, and improve operation characteristics, and a method for fabricating the same.

In accordance with an embodiment of the present invention, a nonvolatile memory device may include: cell strings, each including a plurality of memory cells over a substrate, extending in a direction; channel layers, connected with one sides and the other sides of the cell strings, extending in another direction perpendicular to the substrate; select gate electrodes located over the cell strings and surrounding side surfaces of the channel layers with a gate dielectric layer interposed therebetween; and conductive lines connected with upper ends of the channel layers.

In accordance with another embodiment of the present invention, a method for fabricating a nonvolatile memory device may include: forming a plurality of gate patterns which extend parallel to one another, over a substrate; forming channel layers connecting with junction regions of the substrate and extending in a direction perpendicular to the substrate; forming select gate electrodes which locate over the gate patterns and surround side surfaces of the channel layers with a gate dielectric layer interposed therebetween; and forming conductive lines to be connected with upper ends of the channel layers.

A nonvolatile memory device includes a cell string including a plurality of memory cells over a substrate and a select transistor configured to connect the cell string with a bit line, wherein the select transistor is located over the cell string.

According to the above embodiments, select gate electrodes are formed over a cell string. Thus, a chip size may be reduced. Fabrication processes may be made easy and simple. Operation characteristics of a nonvolatile memory device may be improved.

DETAILED DESCRIPTION

Figure 1:
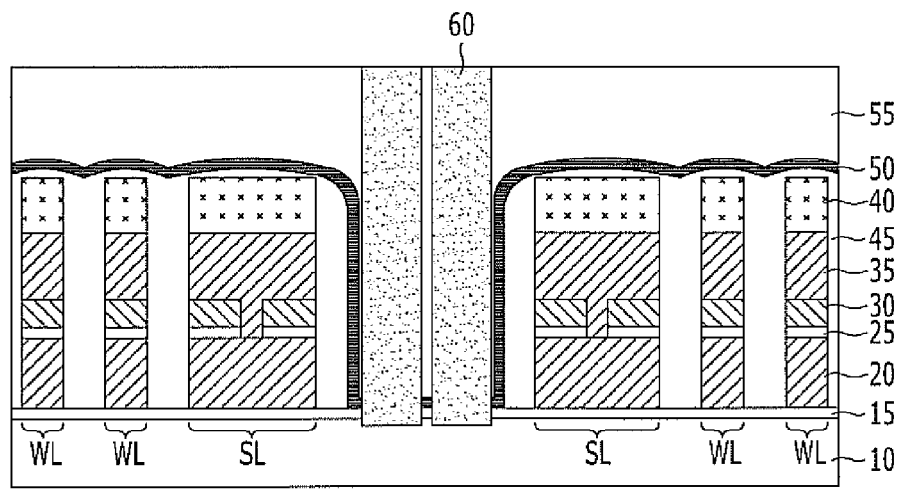
FIG. 1 is a view illustrating a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 10A:
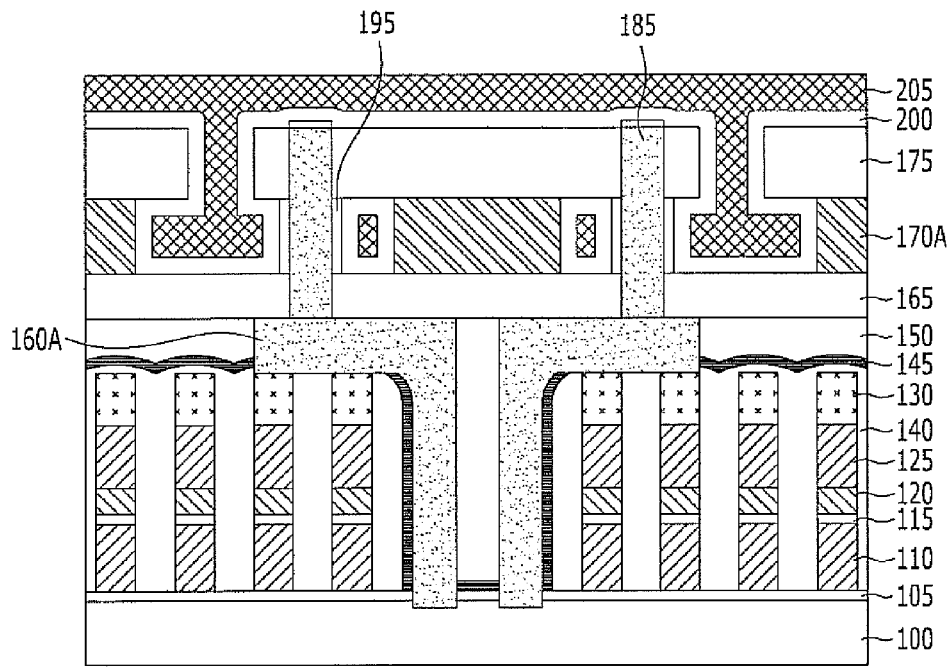
Figure 10B:
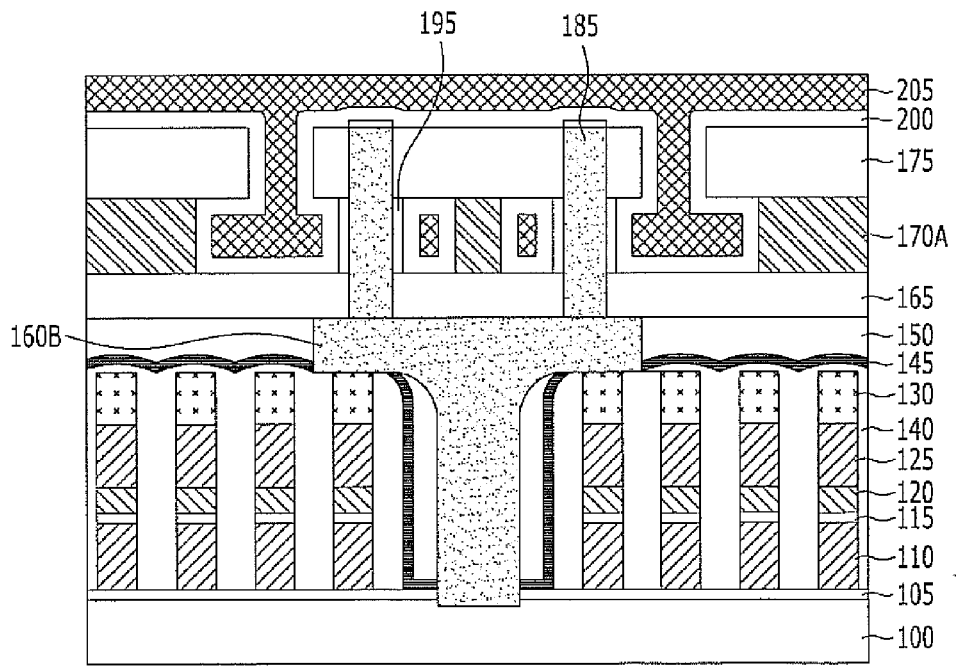
Figure 11A:
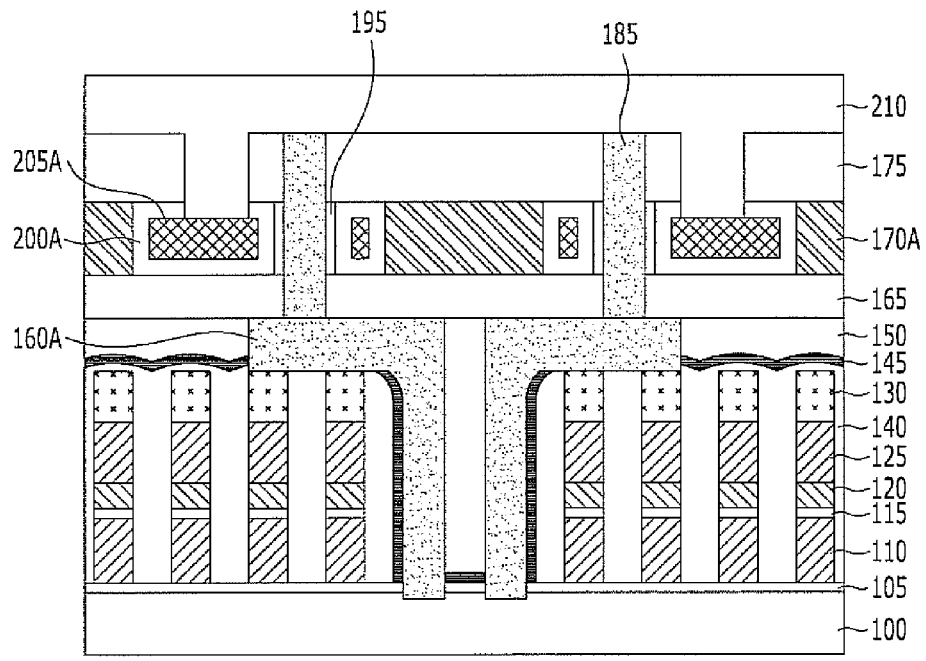
Figure 11B:
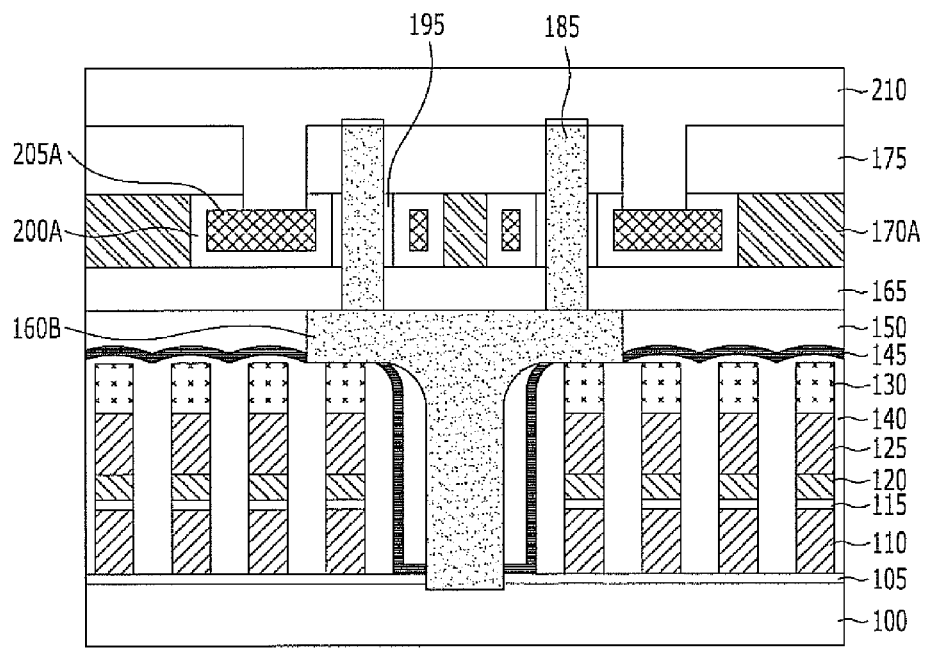
Figure 12A:
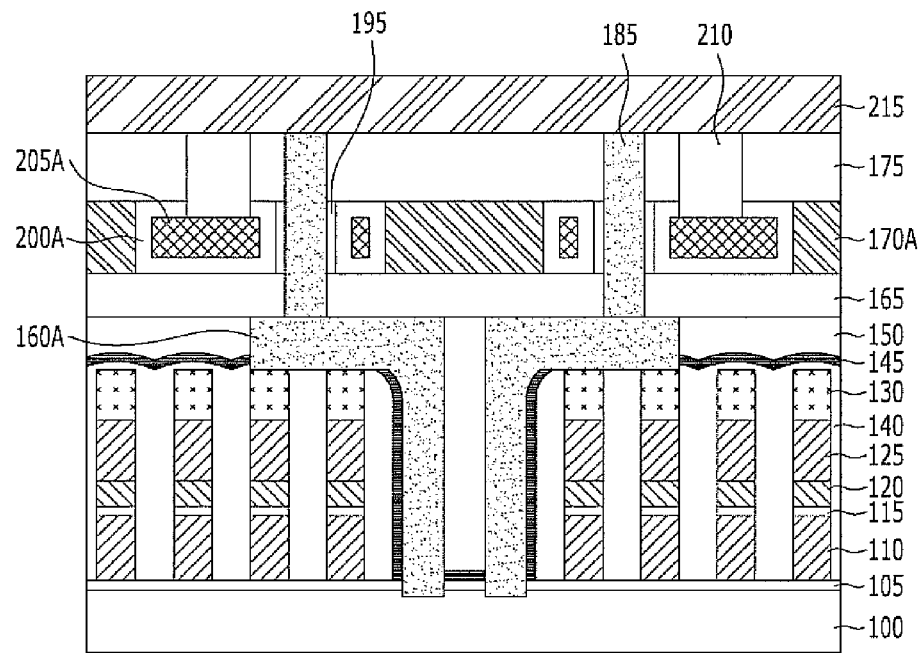
Figure 12B:
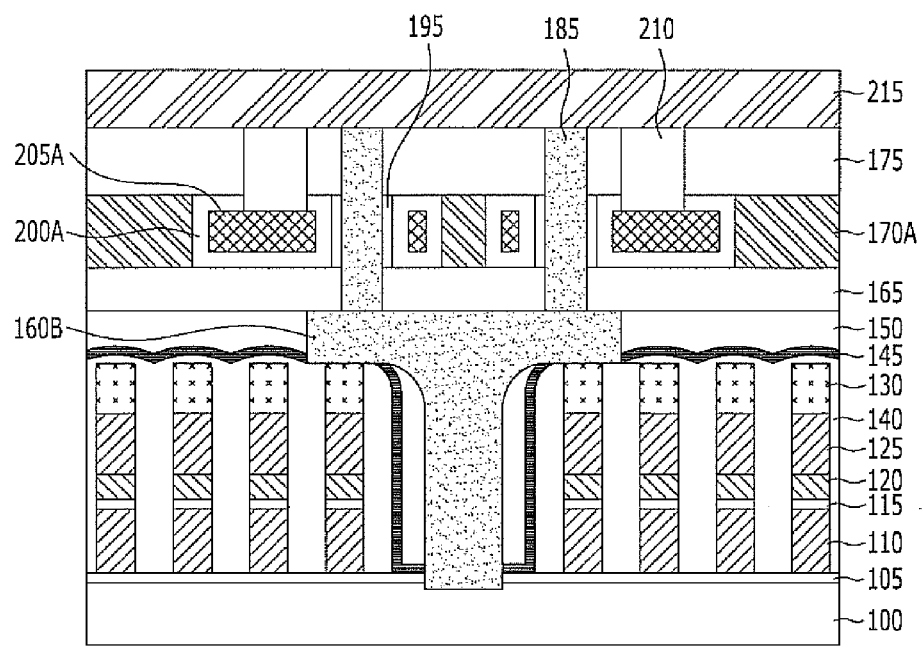

FIGS. 2 to 12B are views explaining a nonvolatile memory device in accordance with a first embodiment of the present invention and a method for fabricating the same. In particular, FIGS. 12A and 12B are views illustrating the nonvolatile memory device in accordance with the first embodiment of the present invention. FIGS. 2A to 11B are views showing processes for fabricating the nonvolatile memory device of FIGS. 12A and 12B.

Figure 2:
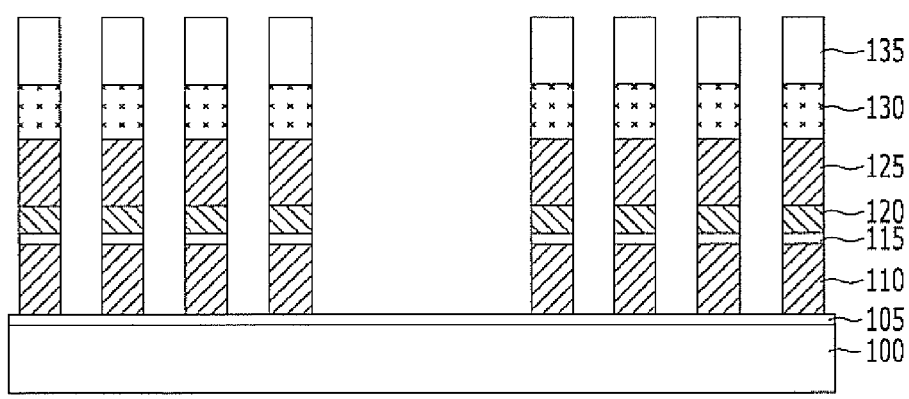
FIGS. 2 to 12B are views explaining a nonvolatile memory device in accordance with a first embodiment of the present invention and a method for fabricating the same.

Referring to FIG. 2, a tunnel dielectric layer 105 is formed on a substrate 100.

The substrate 100 may be a semiconductor substrate such as monocrystalline silicon. The substrate 100 may include a predetermined underlying structure such as an isolation layer (not shown) which defines active regions. A plurality of active regions is defined parallel to one another in the shapes of lines extending in a direction crossing with gate patterns. Cell strings may be formed over the active regions. The tunnel dielectric layer 105 may be formed of an oxide-based substance. For example, the tunnel dielectric layer 105 is a silicon oxide ($SiO_2$) layer which is formed through a thermal oxidation process.

Then, gate patterns including a floating gate electrode layer 110, a charge blocking layer 115, a first control gate electrode layer 120, a second control gate electrode layer 125 and a gate hard mask layer 130, which are sequentially stacked, are formed on the tunnel dielectric layer 105.

While not shown in the drawing, the gate patterns may be formed by processes of: forming a conductive layer for floating gate electrodes, with the shapes of lines which extend along the active regions, on the tunnel dielectric layer 105; sequentially stacking a dielectric layer for a charge blocking layer, a conductive layer for first control gate electrodes, a conductive layer for second control gate electrodes, and a gate hard mask substance layer on the entire surface of the substrate 100 formed with the conductive layer for floating gate electrodes; and then etching these layers up to the conductive layer for floating gate electrodes by using photoresist patterns 135 extending in a direction crossing with the conductive layer for floating gate electrodes as an etch mask. A plurality of gate patterns may be formed to extend parallel to one another. The plurality of gate patterns may have the same width. In order to finely form the gate patterns, a spacer patterning technology may be used. As the gate patterns are formed to have the same width, advantages are provided in that a patterning process may be simplified.

The floating gate electrode layer 110 may include doped polysilicon. The floating gate electrode layer 110 may have the shapes of islands isolated for respective memory cells. The charge blocking layer 115 may be an ONO (oxide-nitride-oxide) layer including an oxide, a nitride, and an oxide sequentially stacked. The gate hard mask layer 130 may include a nitride-based substance. The first control gate electrode layer 120 may include doped polysilicon. The second control gate electrode layer 125 may include a metal silicide which is formed as the first control gate electrode layer 120 is partially silcidated. In particular, the first and second control gate electrode layers 120 and 125 constitute word lines as the gate electrodes of memory cell transistors.

In succession, junction regions (not shown) may be formed in the substrate 100 between the gate patterns through an ion implantation process, and so forth. The junction regions serve as the drains or the sources of the memory cell transistors. The junction regions may have a conductivity type different from that of the substrate 100. Specifically, in a NAND flash memory device, adjoining memory cell transistors share the junction regions. Accordingly, the memory cell transistors are connected in series to constitute cell strings.

Figure 3:
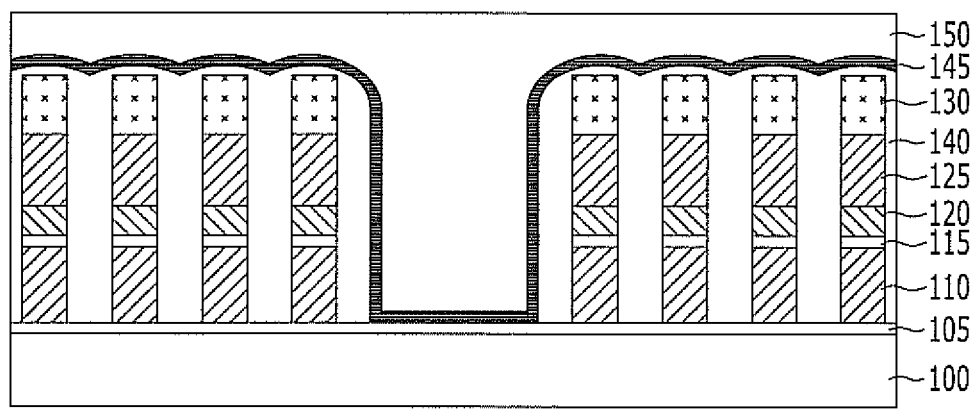

Referring to FIG. 3, after removing the photoresist patterns 135, a first spacer dielectric layer 140 is formed to cover the gate patterns.

The photoresist patterns 135 may be removed through a stripping process. A cleaning process may be additionally performed to remove byproducts and etc. The first spacer dielectric layer 140 may be formed by depositing an oxide-based substance to fill the spaces between the gate patterns and then etching back the oxide-based substance.

Next, a second spacer dielectric layer 145 and a first interlayer dielectric layer 150 are sequentially formed on the first spacer dielectric layer 140.

The second spacer dielectric layer 145 may be formed by conformally depositing a substance such as a nitride-based substance with a different etching selectivity against the first interlayer dielectric layer 150. The first interlayer dielectric layer 150 may be formed by processes of: depositing an oxide-based substance to fill regions where drain and source contact plugs are subsequently formed, i.e., the junction regions between the cell strings; and then performing a planarization process such as chemical mechanical polishing (CMP).

Figure 4A:
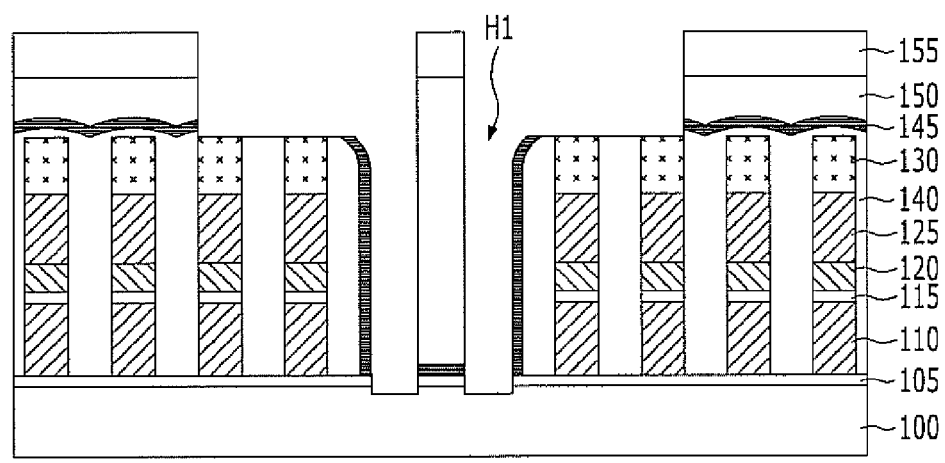

Referring to FIG. 4A, after a first mask pattern 155 is formed on the first interlayer dielectric layer 150 to cover regions excluding the regions where the drain contact plugs are to be subsequently formed, drain contact holes H1 are defined to expose drain regions among the junction regions between the cell strings by etching the first interlayer dielectric layer 150, the second spacer dielectric layer 145, and the tunnel dielectric layer 105 based on the first mask pattern 155 used as an etch mask.

The drain contact holes H1 may be defined through a self-aligned contact (SAC) process using an etching selectivity difference between the first interlayer dielectric layer 150 and the second spacer dielectric layer 145. The upper ends of the drain contact holes H1 may be defined wide to secure a margin of a subsequent process. The gate hard mask layer 130 of the gate patterns adjoining the drain regions may be exposed.

Figure 4B:
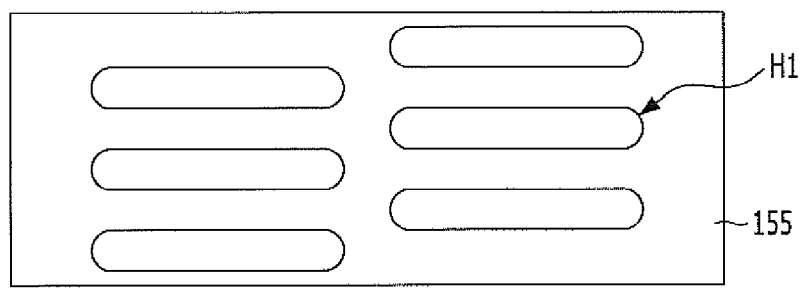

FIG. 4B shows the plan view of the first mask pattern 155 of a drain side. Referring to FIG. 4B, the drain contact holes H1 are arranged along at least two columns which extend in a direction crossing with the cell strings such that adjoining drain contact holes H1 are defined in different columns, so as to sufficiently define a process margin and reduce parasitic capacitance between the drain contact plugs.

Figure 5A:
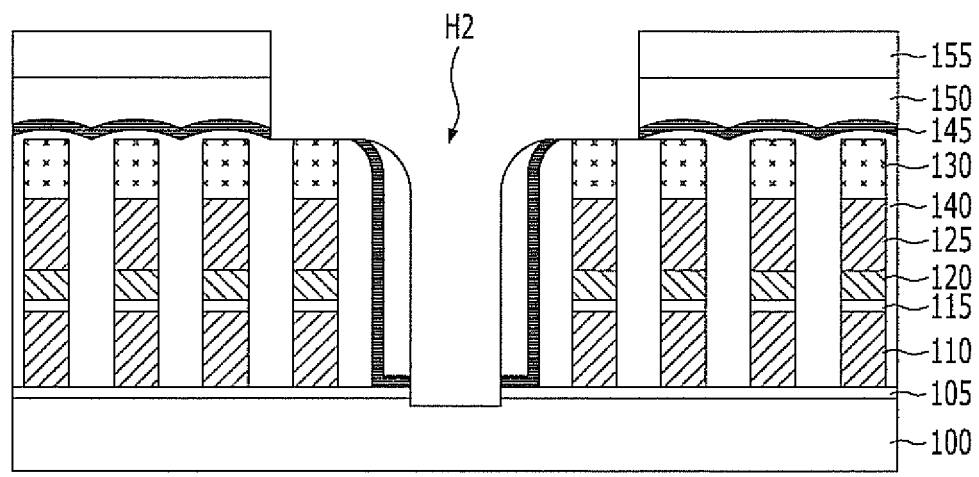

Referring to FIG. 5A, after the first mask pattern 155 is formed on the first interlayer dielectric layer 150 to cover regions excluding the regions where the source contact plugs are to be subsequently formed, source contact holes H2 are defined to expose source regions among the junction regions between the cell strings by etching the first interlayer dielectric layer 150, the second spacer dielectric layer 145, and the tunnel dielectric layer 105 based on the first mask pattern 155 used as an etch mask.

The source contact holes H2 may be defined through a self-aligned contact (SAC) process using an etching selectivity difference between the first interlayer dielectric layer 150 and the second spacer dielectric layer 145. The source contact holes H2 may be defined simultaneously with the drain contact holes H1. Similar to the drain contact holes H1, the upper ends of the source contact holes H2 may be defined wide. The gate hard mask layer 130 of the gate patterns adjoining the source regions may be exposed.

Figure 5B:
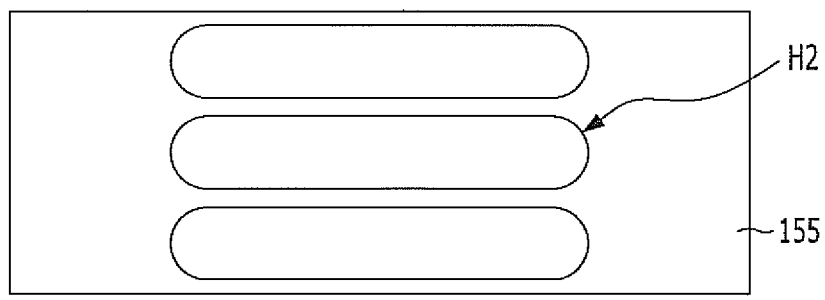

FIG. 5B shows the plan view of the first mask pattern 155 of a source side. Referring to FIG. 5B, the source contact holes H2 may be defined larger than the drain contact holes H1. Accordingly, the source regions of a pair of cell strings adjoining in the direction of the gate patterns may be simultaneously exposed.

Hereafter, processes for the drain side and the source side of the cell strings will be explained together. In drawings to be described below, the suffix 'A' indicates the drain side of the cell strings, and the suffix 'B' indicates the source side of the cell strings.

Figure 6A:
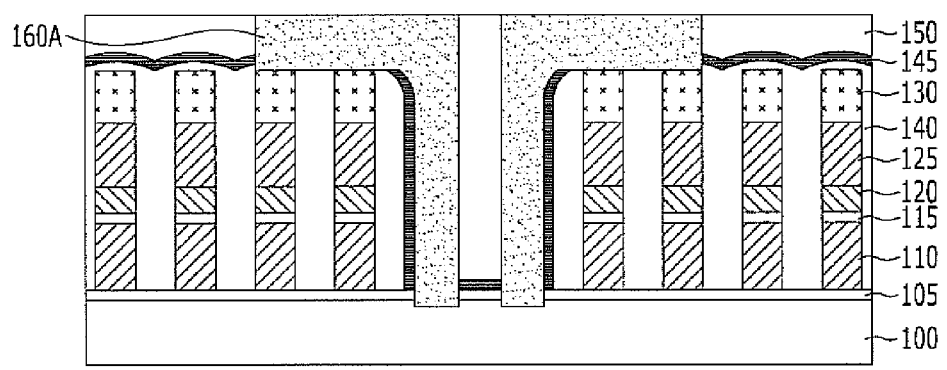
Figure 6B:
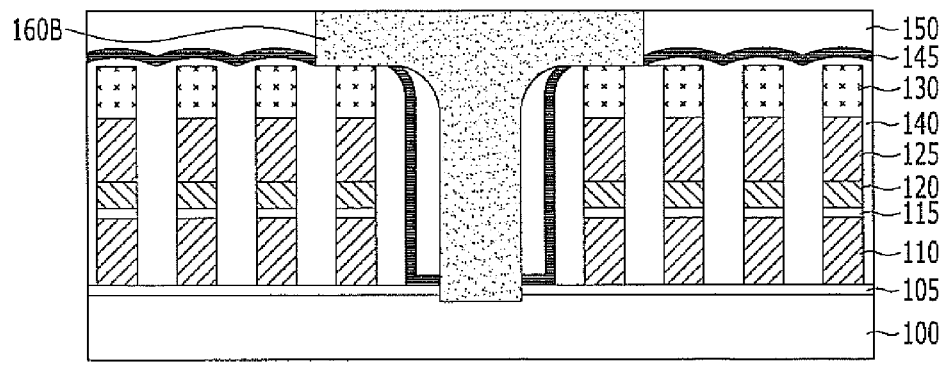

Referring to FIGS. 6A and 6B, after a process of removing the first mask pattern 155, drain contact plugs 160A and source contact plugs 160B are formed in the drain contact holes H1 and the source contact holes H2 by filling a conductive substance in the drain contact holes H1 and the source contact holes H2.

The drain contact plugs 160A and the source contact plugs 160B may be formed by depositing a conductive substance such as doped polysilicon, a metal, or a metal nitride to fill the drain contact holes H1 and the source contact holes H2 and performing a planarization process such as CMP until the upper surface of the first interlayer dielectric layer 150 is exposed.

Figure 7A:
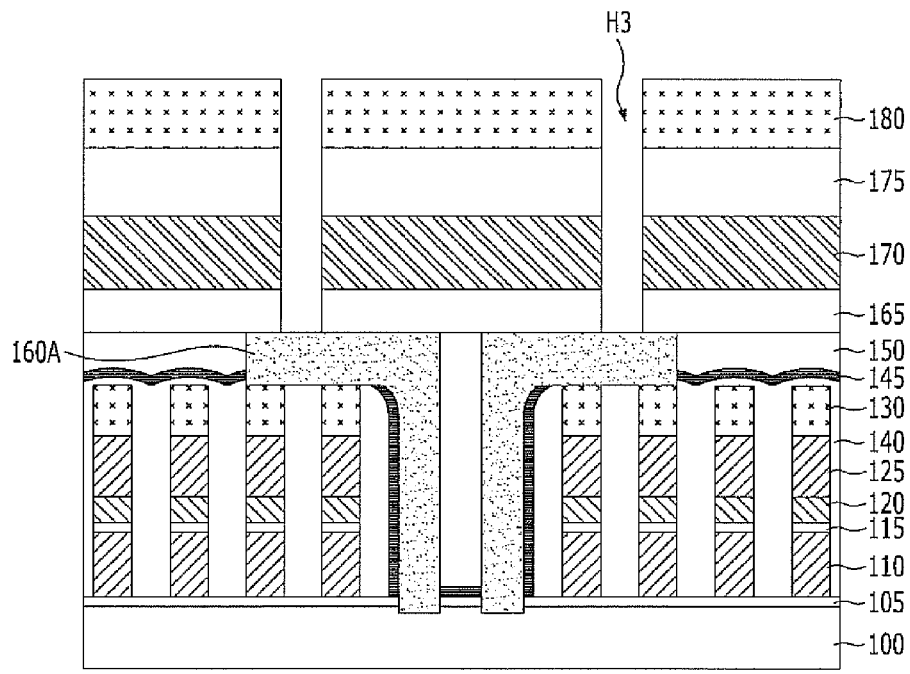
Figure 7B:
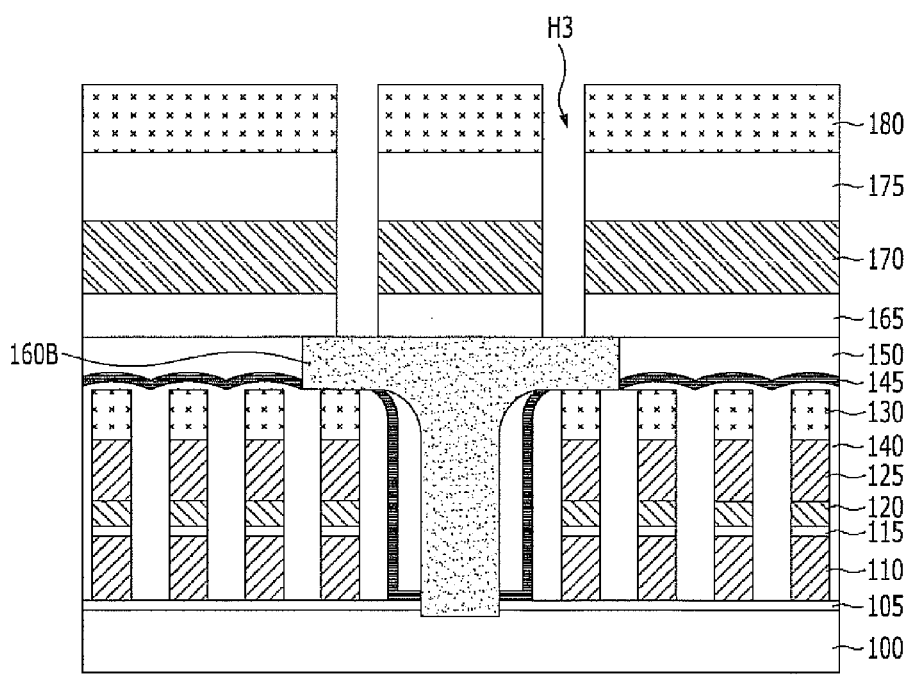

Referring to FIGS. 7A and 7B, a second interlayer dielectric layer 165, a sacrificial layer 170, and a third interlayer dielectric layer 175 are sequentially formed on the resultant structure where the drain contact plugs 160A and the source contact plugs 160B are formed.

The second and third interlayer dielectric layers 165 and 175 may be formed by depositing an oxide-based substance such as a TEOS (tetra ethyl ortho silicate) oxide and an HDP (high density plasma) oxide. Also the sacrificial layer 170 may be formed by depositing a substance with a different etching selectivity against the second and third interlayer dielectric layers 165 and 175, for example, a nitride-based substance.

Then, after forming a second mask pattern 180 on the third interlayer dielectric layer 175 to cover the entire surface excluding regions where channel layers are to be subsequently formed, channel holes H3 are defined to expose portions of the drain contact plugs 160A and the source contact plugs 160B by etching the third interlayer dielectric layer 175, the sacrificial layer 170, and the second interlayer dielectric layer 165 based on the second mask pattern 180 used as an etch mask.

Figure 8A:
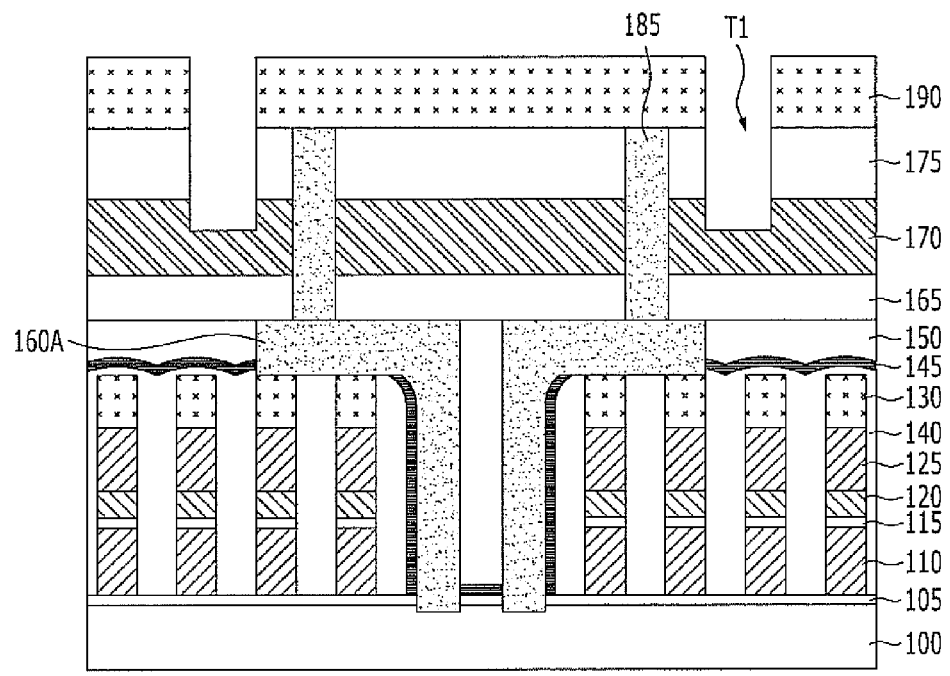
Figure 8B:
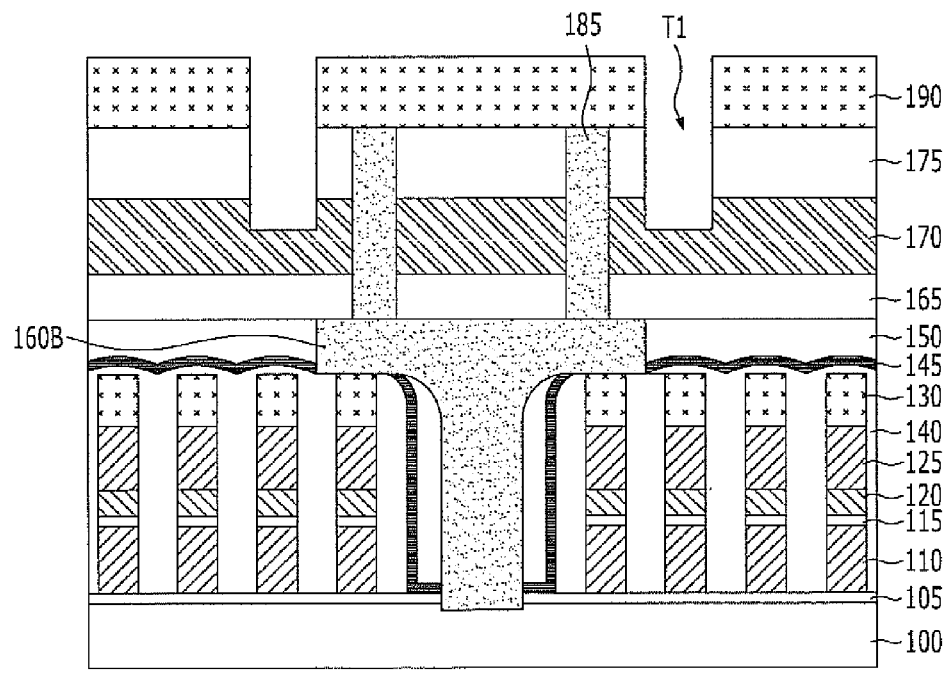

Referring to FIGS. 8A and 8B, after a process of removing the second mask pattern 180, channel layers 185 are formed by filling a semiconductor substance in the channel holes H3.

The channel layers 185 may be formed by depositing a semiconductor substance such as polysilicon to fill the channel holes H3 and performing a planarization process such as CMP until the upper surface of the third interlayer dielectric layer 175 is exposed. The channel layers 185 are connected with the junction regions through the drain contact plugs 160A and the source contact plugs 160B. The channel layers 185 may extend in a direction perpendicular to the substrate 100.

Thereafter, after a third mask pattern 190 is formed on the third interlayer dielectric layer 175 and the channel layers 185 to cover the entire surface excluding regions where first trenches are to be defined, first trenches T1 are defined to expose portions of the sacrificial layer 170 by etching the third interlayer dielectric layer 175 based on the third mask pattern 190 used as an etch mask. The first trenches T1 may be defined in the shape of slits which adjoin the channel layers 185 and extend in the direction of the gate patterns. As a result of this process, portions of the sacrificial layer 170 may be etched.

Figure 9A:
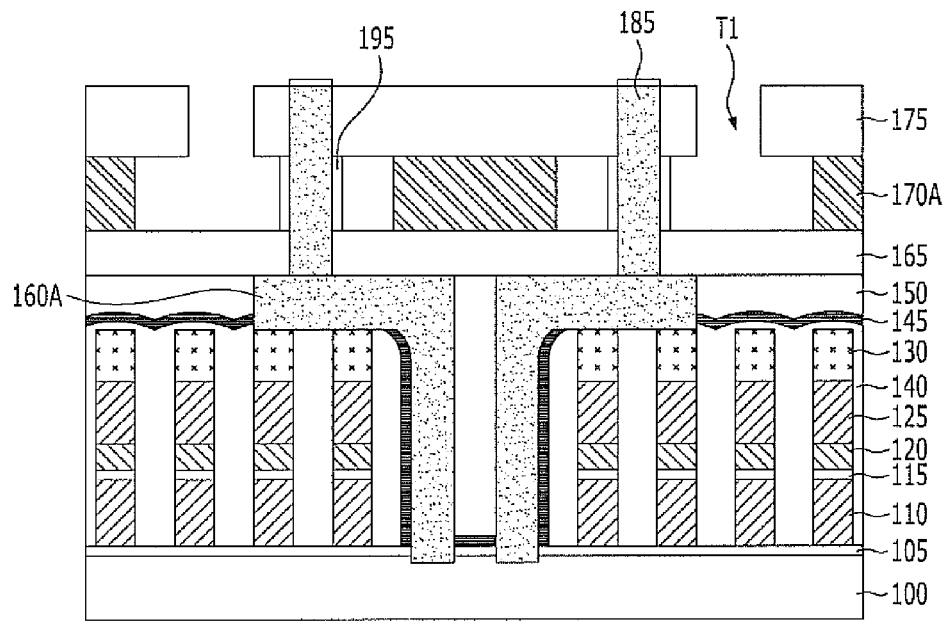
Figure 9B:
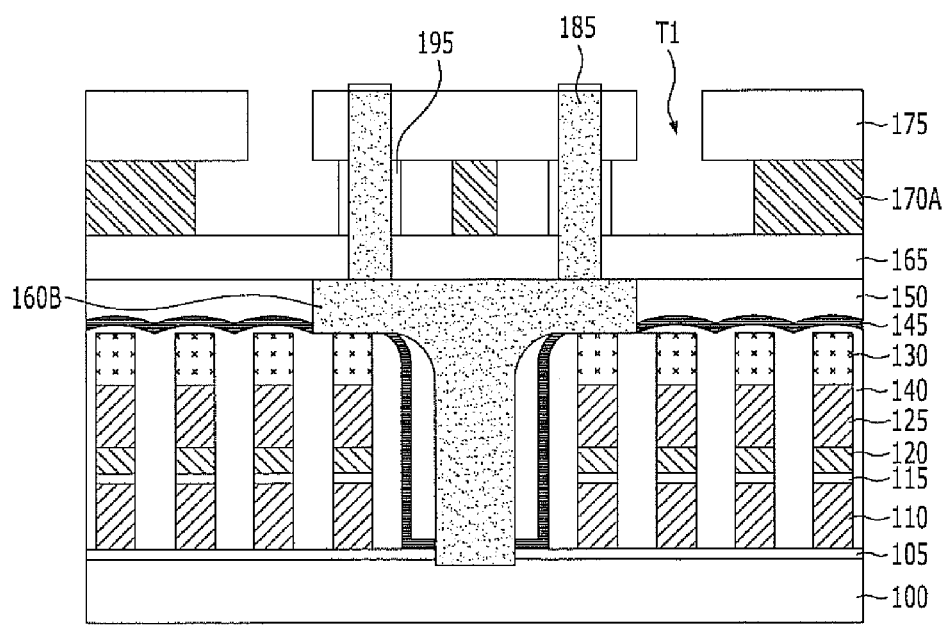

Referring to FIGS. 9A and 9B, after removing the third mask pattern 190, the portions of the sacrificial layer 170 which are exposed through the first trenches T1 are removed to expose the side surfaces of the channel layers 185. In order to partially remove the sacrificial layer 170, a wet etching process using a different etching selectivity against the second and third interlayer dielectric layers 165 and 175 may be performed. The remaining sacrificial layer 170 will be referred to as sacrificial layer patterns 170A.

Thereupon, a gate dielectric layer 195 is formed on the side surfaces of the channel layers 185. The gate dielectric layer 195 may be formed by oxidating the channel layers 185 through a thermal oxidation process. The gate dielectric layer 195 may also be formed on the upper surfaces of the channel layers 185 which are exposed.

Referring to FIGS. 10A and 10B, a first conductive layer 200 for select gate electrodes is formed on the walls of the spaces created due to the removal of the sacrificial layer 170, through the first trenches T1.

The first conductive layer 200 for select gate electrodes may be formed by conformally depositing a conductive substance such as doped polysilicon, through atomic layer deposition (ALD) or chemical vapor deposition (CVD).

After that, a second conductive layer 205 for select gate electrodes is formed on the first conductive layer 200 for select gate electrodes.

The second conductive layer 205 for select gate electrodes may be formed by depositing a conductive substance such as a metal to fill the spaces created due to the removal of the sacrificial layer 170. For example, the second conductive layer 205 for select gate electrodes may be formed by nucleating tungsten and then depositing bulk tungsten. Meanwhile, before the second conductive layer 205 is formed for select gate electrodes, a barrier metal layer may be formed to improve interfacial characteristics by additionally depositing a metal nitride such as a tungsten nitride (WN) or a titanium nitride (TiN) on the first conductive layer 200 for select gate electrodes.

Referring to FIGS. 11A and 11B, a first select gate electrode layer 200A and a second select gate electrode layer 205A are formed by removing the first conductive layer 200 and the second conductive layer 205 which are formed in and over the first trenches T1.

In order to partially remove the first and second conductive layers 200 and 205 for select gate electrodes, an etch-back process may be performed. In particular, the first and second select gate electrode layers 200A and 205A as the gate electrodes of select transistors are positioned over the gate patterns. The first and second select gate electrode layers 200A and 205A may be formed in the shape of lines which extend in the direction of the gate patterns while surrounding the side surfaces of the channel layers 185 with the gate dielectric layer 195 interposed therebetween.

Then, a fourth interlayer dielectric layer 210 is formed on the resultant structure where the first and second select gate electrode layers 200A and 205A are formed. The fourth interlayer dielectric layer 210 may be formed by depositing an oxide-based substance such as TEOS oxide and an HDP oxide.

Referring to FIGS. 12A and 12B, conductive lines 215 are formed through the fourth interlayer dielectric layer 210 to be connected with the upper ends of the channel layers 185.

The conductive lines 215 may be formed by defining slit-shaped trenches (not shown) and filling the trenches with a conductive substance such as doped polysilicon, a metal, or a metal nitride. The slit-shaped trenches is formed by a process of selectively etching the fourth interlayer dielectric layer 210 to expose the upper surfaces of the channel layers 185 and extend in the direction crossing with the gate patterns. A pair of channel layers 185 which are respectively connected with the drain contact plug 160A and the source contact plug 160B may be connected with each other by the conductive line 215 which is formed as a result of this process.

By the fabrication method described above, the nonvolatile memory device in accordance with the first embodiment of the present invention as shown in FIGS. 12A and 12B may be fabricated.

Referring to FIGS. 12A and 12B, the nonvolatile memory device in accordance with the first embodiment of the present invention may include the cell strings which are disposed on the substrate 100, the channel layers 185 which are connected with the drain sides and the source sides of the cell strings and extend in the direction perpendicular to the substrate 100, the first and second select gate electrode layers 200A and 205A which are disposed over the cell strings and surround the side surfaces of the channel layers 185 with the gate dielectric layer 195 interposed therebetween, and the conductive lines 215 which are connected with the uppers end of the channel layers 185. In each cell string, a plurality of memory cells is connected in series to extend in one direction.

The memory cells may include the gate patterns including the floating gate electrode layer 110, the charge blocking layer 115, the first and second control gate electrode layers 120 and 125 and the gate hard mask layer 130, which are sequentially stacked.

The plurality of cell strings may be arranged parallel to one another. The drain sides and the source sides of the cell strings may be connected with the channel layers 185 through the drain contact plugs 160A and the source contact plugs 160B, respectively.

The drain contact plugs 160A and the source contact plugs 160B may partially cover the cell strings. In particular, the source contact plugs 160B may be simultaneously connected with a pair of cell strings which adjoin each other.

The first and second select gate electrode layers 200A and 205A may be in the shape of lines which extend in the direction crossing with the cell strings. The conductive line 215 may connect the pair of channel layers 185 which are connected with the drain sides and the source sides of the cell strings. Specifically, while a pair of drain contact plugs 160A adjoining each other and a pair of source contact plugs 160B adjoining each other are connected to one conductive line 215, the drain contact plugs 160A and the source contact plugs 160B may be independently controlled through the first and second select gate electrode layers 200A and 205A. As a consequence, operational characteristics of the nonvolatile memory device may be improved.

Figure 13A:
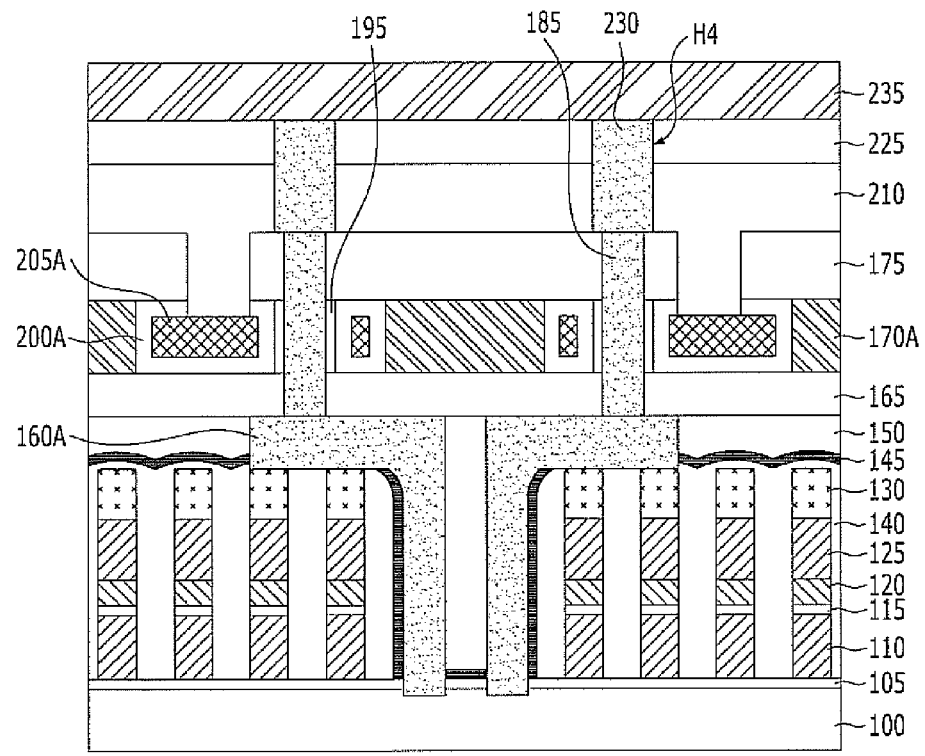
FIGS. 13A and 13B are views explaining a nonvolatile memory device in accordance with a second embodiment of the present invention and a method for fabricating the same.
Figure 13B:
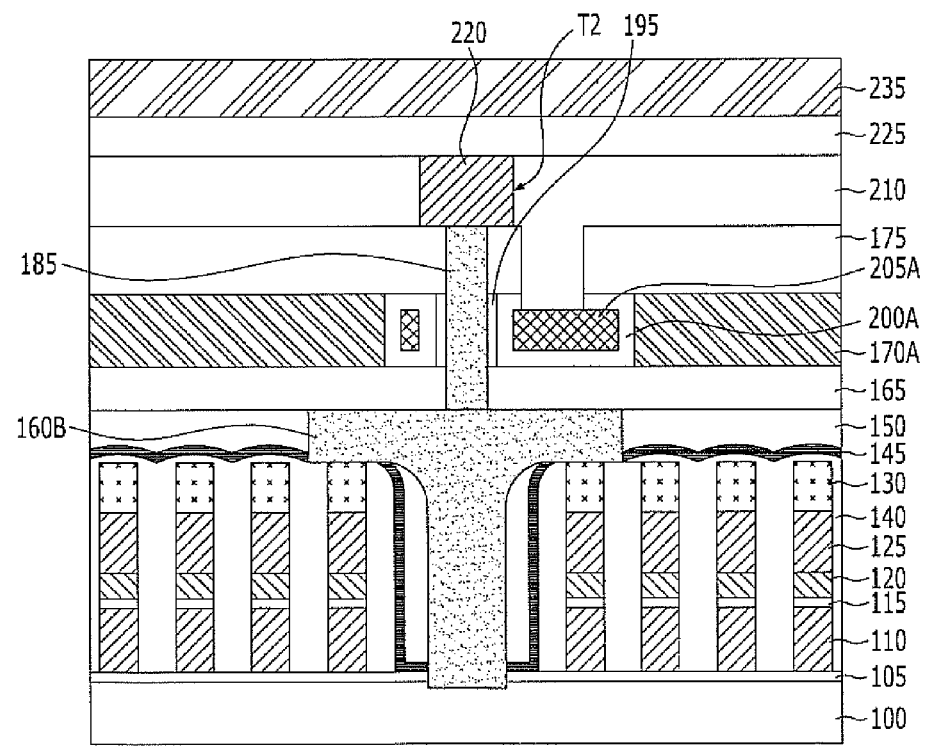

FIGS. 13A and 13B are views explaining a nonvolatile memory device in accordance with a second embodiment of the present invention and a method for fabricating the same. In describing the second embodiment, detailed descriptions for substantially the same component parts as the aforementioned first embodiment will be omitted. After the processes of FIGS. 2 to 11B are performed in the same manner as the first embodiment, the process of FIGS. 13A and 13B is performed.

Referring to FIGS. 13A and 13B, after a process of defining second trenches T2 by selectively etching the fourth interlayer dielectric layer 210 to expose the upper surfaces of the channel layers 185 on the source contact plugs 160B, a source line 220 is formed in the second trenches T2. In order to commonly use the source line 220, the channel layers 185 on the source contact plugs 160B may be disposed in a line.

The second trenches T2 may be defined in the shape of slits which extend in the direction of the gate patterns. The source line 220 may be formed by depositing a conductive substance such as doped polysilicon, a metal, or a metal nitride to fill the second trenches T2, and then performing a planarization process such as chemical mechanical polishing (CMP) until the upper surface of the fourth interlayer dielectric layer 210 is exposed.

In succession, after a process of forming a fifth interlayer dielectric layer 225 on the fourth interlayer dielectric layer 210 and the source line 220, contact holes H4 are defined to expose the upper surfaces of the channel layers 185 over the drain contact plugs 160A by selectively etching the fourth and fifth interlayer dielectric layers 210 and 225. The fifth interlayer dielectric layer 225 may be formed by depositing an oxide-based substance such as a TEOS oxide and an HDP oxide.

Next, after a process of forming contact plugs 230 in the contact holes H4, bit lines 235 are formed to be connected with the upper ends of the contact plugs 230.

The contact plugs 230 may be formed by filling the contact holes H4 with a conductive substance such as doped polysilicon, a metal, and a metal nitride. The bit lines 235 may be formed by defining trenches (not shown) in the shape of slits which extend in the direction crossing with the gate patterns and then filling the trenches with a conductive substance such as doped polysilicon, a metal, and a metal nitride. The trenches exposing the upper surfaces of the contact plugs 230 is formed through depositing a dielectric layer (not shown) on the fifth interlayer dielectric layer 225 and the contact plugs 230 and selectively etching the dielectric layer.

In particular, by forming the bit lines 235 to be simultaneously connected with a pair of contact plugs 230 adjoining each other, it is possible to allow the pair of cell strings adjoining each other to commonly use the bit line 235. In this case, since the bit lines 235 may be formed to have a large width, a process for patterning the bit lines 235 may be easy and simple.

As is apparent from the above descriptions, in the resistance variable memory device and the method for fabricating the same according to the embodiments of the present invention, a chip size may be reduced and fabrication processes may be made easy and simple because select gate electrodes are formed over a cell string in an SGT (surround gate transistor) shape. Moreover, it is possible to prevent occurrence of perturbation by hot carrier injection (HCI) which otherwise occurs in word lines adjoining the select gate electrodes. The threshold voltage distribution of memory cells may be improved to ameliorate durability and data retention characteristics, Specifically, a bit line may be commonly used and a pair of cell strings may be independently controlled through the select gate electrodes. Source line bouncing may be prevented to sufficiently secure a sensing margin.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
cell strings, each including a plurality of memory cells over a substrate, wherein the plurality of memory cells are connected electrically in series in a first direction parallel to an upper surface of the substrate;
channel layers, connected electrically with a first junction region and a second junction region of the cell strings in the substrate, extending in a second direction perpendicular to the upper surface of the substrate, and formed of semiconductor substance, wherein each of the channel layers includes a top surface which is parallel to the upper surface of the substrate, a bottom surface which is parallel to the upper surface of the substrate and is positioned lower than the top surface, and a side surface which connects the top surface and the bottom surface with each other between the top surface and the bottom surface;

select gate electrodes, located over the cell strings, surrounding the side surfaces of the channel layers with a gate dielectric layer interposed therebetween; and conductive lines connected electrically with the top surface of each of the channel layers, wherein the channel layer, the select gate electrode and the gate dielectric layer form a select transistor, wherein the first junction region is connected electrically with the channel layer through a drain contact plug which is conductive, and the second junction region is connected electrically with the channel layer through a source contact plug which is conductive, wherein each of the drain contact plug and the source contact plug has a lower portion and an upper portion located over the lower portion in the second direction, and a width of the upper portion is larger than a width of the lower portion, wherein the memory cells comprise stack structures each including a floating gate electrode, a charge blocking layer, and a control gate electrode sequentially stacked, and wherein the upper portion of each of the drain contact plug and the source contact plug is located over the stack structures in the second direction and covers in the second direction a top surface of at least one of the stack structures, the top surface of the at least one of the stack structures is parallel to the first direction, and the lower portion of each of the drain contact plug and the source contact plug is located under the upper portion in the second direction and between the stack structures of one of the cell strings and the stack structures of another one of the cell strings in the first direction and does not cover in the second direction the top surface of the at least one of the stack structures.

2. The nonvolatile memory device according to claim 1, wherein the select gate electrodes have shapes of lines which extend in a third direction crossing with the cell strings.

3. The nonvolatile memory device according to claim 1, wherein
the conductive lines contact a pair of the channel layers which are respectively connected electrically with the first junction region and second junction region of the cell strings.

4. The nonvolatile memory device according to claim 1, wherein each of the conductive lines comprises any one of a bit line and a source line, and
wherein the bit line and the source line are respectively connected electrically with one side and the other side of the cell strings through the channel layers.

5. The nonvolatile memory device according to claim 1, wherein the cell strings are arranged parallel to one another, and
wherein the source contact plug is simultaneously connected electrically with a pair of the cell strings which adjoin each other.

6. A nonvolatile memory device, comprising:
a cell string including a plurality of memory cells over a substrate, wherein the plurality of memory cells are connected electrically in series in a first direction parallel to an upper surface of the substrate;
a select transistor configured to connect electrically the cell string with a bit line and include a channel layer and a gate electrode, wherein the channel layer extends in a second direction perpendicular to the upper surface of the substrate to include a top surface which is parallel to the upper surface of the substrate, a bottom surface which is parallel to the upper surface the substrate and is positioned lower than the top surface, and a side surface which connects the top surface and the bottom surface with each other between the top surface and the bottom surface and is formed of semiconductor substance, and the gate electrode surrounds the side surface of the channel layer; and
a contact plug connected electrically with the channel layer under the channel layer, and formed of a conductive substance,
wherein a bottom of the select transistor is located over a top of the cell string,
wherein the contact plug has a lower portion and an upper portion located over the lower portion in the second direction, and a width of the upper portion is larger than a width of the lower portion,
wherein the memory cells comprise gate electrodes, and
wherein the upper portion of the contact plug is located over the gate electrodes of the memory cells in the second direction and covers in the second direction a top surface of at least one of the gate electrodes of the memory cells, the top surface of the at least one of the gate electrodes of the memory cells is parallel to the first direction, and the lower portion of the contact plug is located under the upper portion in the second direction and does not cover in the second direction the top surface of the at least one of the gate electrodes of the memory cells.

* * * * *